(12) United States Patent
Li

(10) Patent No.: US 10,629,493 B2
(45) Date of Patent: Apr. 21, 2020

(54) SEMICONDUCTOR FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/968,989

(22) Filed: May 2, 2018

(65) Prior Publication Data

US 2018/0323192 A1 Nov. 8, 2018

(30) Foreign Application Priority Data

May 3, 2017 (CN) .......................... 2017 1 0305188

(51) Int. Cl.

| | |
|---|---|
| *H01L 21/8234* | (2006.01) |
| *H01L 27/088* | (2006.01) |
| *H01L 29/06* | (2006.01) |
| *H01L 21/765* | (2006.01) |
| *H01L 29/40* | (2006.01) |

(Continued)

(52) U.S. Cl.
CPC .... *H01L 21/823481* (2013.01); *H01L 21/765* (2013.01); *H01L 21/76229* (2013.01); *H01L 21/823431* (2013.01); *H01L 27/0886* (2013.01); *H01L 29/0649* (2013.01); *H01L 29/404* (2013.01); *H01L 29/66545* (2013.01)

(58) Field of Classification Search
CPC ....... H01L 21/823481; H01L 21/76224; H01L 21/823431; H01L 21/02107–02362; H01L 21/762–76297
See application file for complete search history.

(56) References Cited

U.S. PATENT DOCUMENTS

| 9,653,583 | B1* | 5/2017 | Zhao ................. H01L 29/66795 |
|---|---|---|---|
| 2014/0145250 | A1* | 5/2014 | Cheng ..................... H01L 29/16 257/289 |
| 2016/0225677 | A1* | 8/2016 | Jacob .................... H01L 21/845 |

(Continued)

*Primary Examiner* — Scott B Geyer
(74) *Attorney, Agent, or Firm* — Anova Law Group, PLLC

(57) ABSTRACT

A method for fabricating a semiconductor structure includes providing a substrate including isolation regions and a device region between adjacent isolation regions; forming a plurality of fin structures, including a first plurality of fin structures on the isolation regions and a second plurality of fin structures on the device region of the substrate; forming an isolation layer, having a top surface lower than top surfaces of the fin structures, on the substrate between adjacent fin structures; etching the first plurality of fin structures on the isolation regions after forming the isolation layer; and forming a gate structure across the second plurality of fin structures on the device region after etching the first plurality of fin structures formed on the isolation regions. The gate structure covers a portion of sidewall and top surfaces of each fin structure of the second plurality of fin structures on the device region.

18 Claims, 9 Drawing Sheets

(51) Int. Cl.
 *H01L 29/66* (2006.01)
 *H01L 21/762* (2006.01)

(56) References Cited

U.S. PATENT DOCUMENTS

| | | | |
|---|---|---|---|
| 2017/0069549 A1* | 3/2017 | Basker | H01L 29/66803 |
| 2017/0140997 A1* | 5/2017 | Pae | H01L 21/823807 |
| 2017/0263454 A1* | 9/2017 | Li | H01L 21/0337 |
| 2018/0019171 A1* | 1/2018 | Cheng | H01L 21/823418 |
| 2018/0040703 A1* | 2/2018 | Chang | H01L 29/41791 |
| 2019/0019731 A1* | 1/2019 | Lin | H01L 21/823431 |

* cited by examiner

SEMICONDUCTOR FABRICATION METHODS THEREOF

CROSS-REFERENCES TO RELATED APPLICATIONS

This application claims the priority of Chinese Patent Application No. CN201710305188.4, filed on May 3, 2017, the entire content of which is incorporated herein by reference.

FIELD OF THE DISCLOSURE

The present disclosure generally relates to the field of semiconductor fabrication technology and, more particularly, relates to semiconductor structures and their fabrication methods.

BACKGROUND

In semiconductor manufacturing, with the development trend of very large scale integrated circuits, the feature sizes of integrated circuits (ICs) are continuously reduced. In order to accommodate the reduction of the feature size, the channel length of metal-oxide-semiconductor field-effect transistors (MOSFETs) may be reduced accordingly. However, as the channel length of the devices is reduced, the distance between the source and the drain of the devices is also reduced. Therefore, the ability of the gate in controlling the channel may be deteriorated, and thus pinching off the channel by the gate may become more and more difficult. As such, the sub-threshold leakage phenomenon, i.e. the short-channel effect (SCE), may more easily take place.

Therefore, to better accommodate the reduction of the feature size, the semiconductor process gradually switches from planar MOSFET devices to more efficient three-dimensional (3D) transistor devices, such as fin field-effect transistors (Fin-FETs). In a Fin-FET, the gate may be able to control an ultra-thin structure (i.e., a fin structure) from at least two side surfaces. As compared to a planar MOSFET device, the gate in a Fin-FET may demonstrate stronger ability in controlling the channel, and thus the SCE may be suppressed. In addition, as compared to other devices, Fin-FETs have better compatibility with the existing IC manufacturing.

However, the electrical performance of the conventional semiconductor structures may still need to be improved. The disclosed semiconductor structures and fabrication methods are directed to solve one or more problems set forth above and other problems in the art.

BRIEF SUMMARY OF THE DISCLOSURE

One aspect of the present disclosure provides a method for fabricating a semiconductor structure. The method includes providing a substrate including isolation regions and a device region between adjacent isolation regions; forming a plurality of fin structures, including a first plurality of fin structures on the isolation regions and a second plurality of fin structures on the device region of the substrate; forming an isolation layer, having a top surface lower than top surfaces of the fin structures, on the substrate between adjacent fin structures; etching the first plurality of fin structures on the isolation regions after forming the isolation layer; and forming a gate structure across the second plurality of fin structures on the device region after etching the first plurality of fin structures formed on the isolation regions. The gate structure covers a portion of sidewall and top surfaces of each fin structure of the second plurality of fin structures on the device region.

Another aspect of the present disclosure provides a semiconductor structure. The semiconductor structure includes a substrate including isolation regions and a device region between adjacent isolation regions, a plurality of fin structures formed on the device region of the substrate, and an isolation layer formed on the substrate. The top surface of the isolation layer is lower than the top surfaces of the fin structures, and the height of each fin structure exposed by the isolation layer is identical.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

FIGS. 1-5 illustrate schematic views of semiconductor structures at certain stages for fabricating a semiconductor structure.

Figure 1:
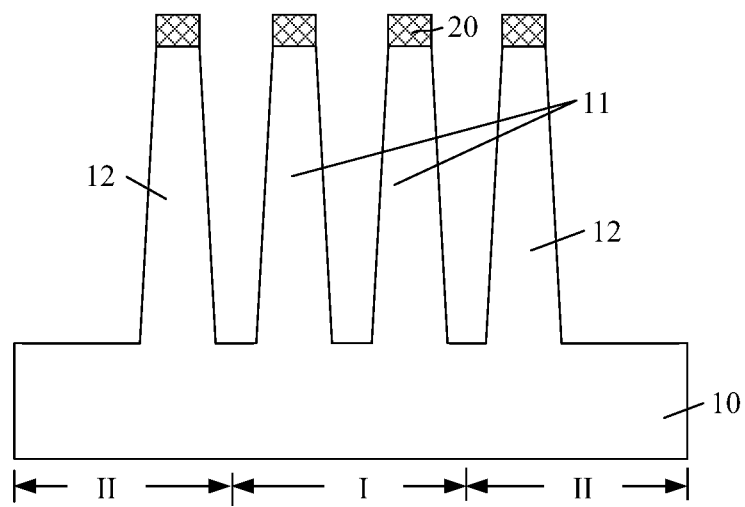
FIGS. 1-5 illustrate schematic views of semiconductor structures at certain stages for fabricating a semiconductor structure.

Referring to FIG. 1, a substrate 10 is provided. The substrate 10 includes a device region I and isolation regions II separated by the device region I. Moreover, a plurality of discrete fin structures (not labeled) are formed on the substrate 10, including both the device region I and the isolation region II.

Specifically, the fin structures formed in the device region I are first fin structures 11, and the fin structures formed in the isolation region II are second fin structures 12. A fin-structure mask layer 20 is formed on the top surfaces of the plurality of fin structures. The fin-structure mask layer 20 is used as an etching mask during the process to form the substrate 10 and the plurality of fin structures.

Figure 2:
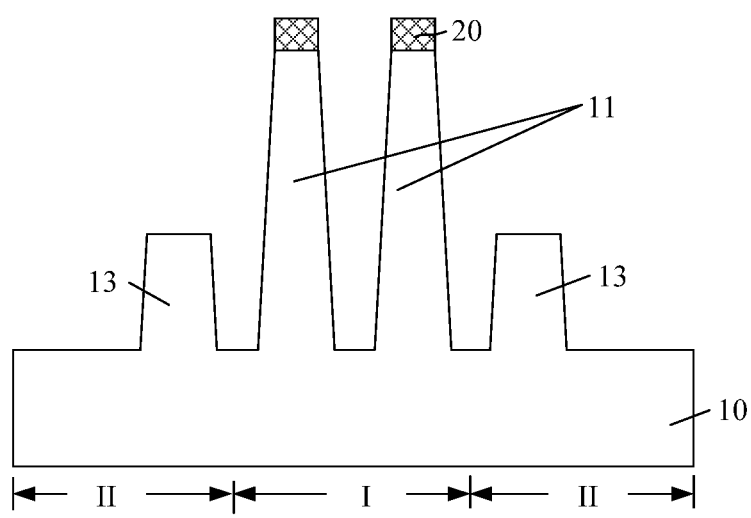

Referring to FIG. 2, a top portion of each second fin structure 12 is removed by etching to form a dummy fin structure 13 in the isolation regions II.

Figure 3:
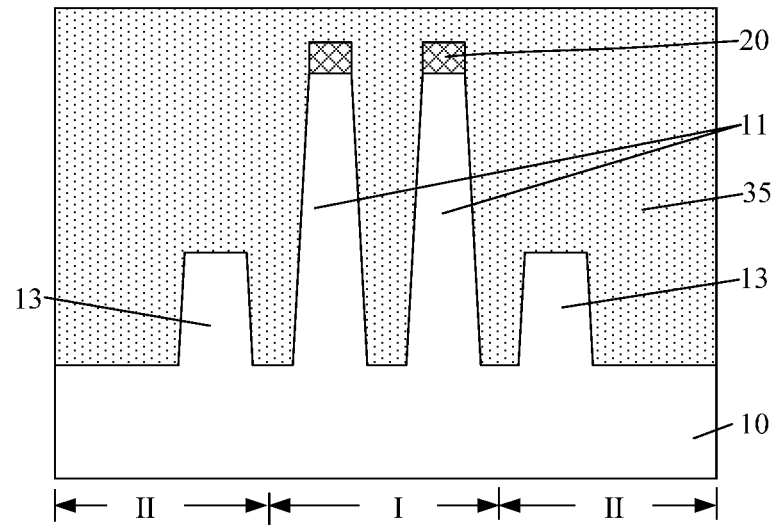

Referring to FIG. 3, an isolation material layer 35 is formed on the substrate 10. The isolation material layer 35 covers the top surface of the fin-structure mask layer 20.

Figure 4:
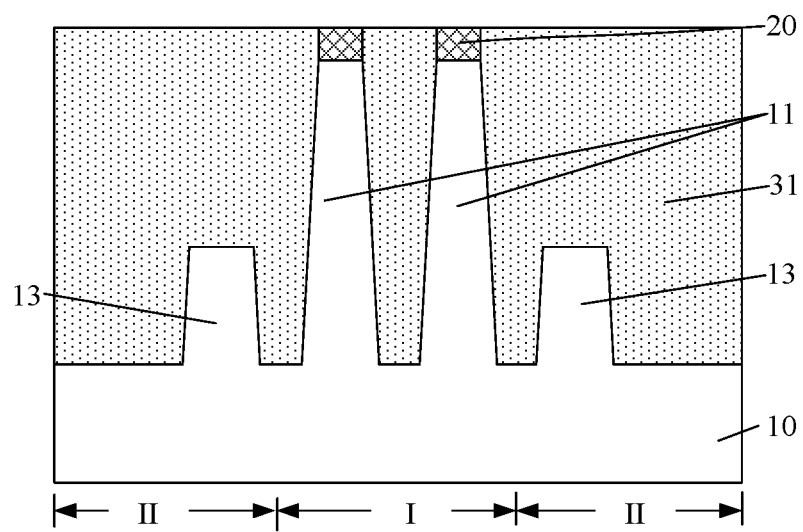

Referring to FIG. 4, the portion of the isolation material layer 35 (referring to FIG. 3) formed above the top surface of the fin-structure mask layer 20 is removed to form an isolation film 31.

Figure 5:
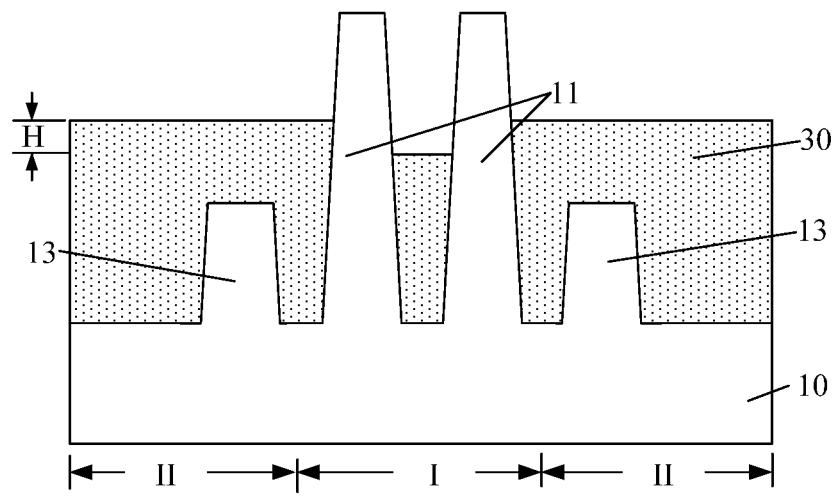

Referring to FIG. 5, a top portion of the isolation film 31 (referring to FIG. 4) is etched back to form an isolation layer 30.

However, because the top surface of the dummy fin structure 13 is lower than the top surface of the first fin structure 11, the environment surrounding on the two sides of the first fin structure 11 adjacent to a dummy fin structure 13 are different. During the process to etch back the top portion of the isolation film 31, the loading effect may easily take place, leading to the etch rate on the portion of the isolation film 31 on the side close to the dummy fin structure 13 smaller than the etch rate on the portion of the isolation film 31 between the two adjacent first fin structures 11. Therefore, the isolation layer 30 may have different heights on the two sides of the first fin structure 11 adjacent to a dummy fin structure 13. That is, the isolation layer 30 may have a height difference H (referring to FIG. 5) on the two sides of the first fin structure. As such, the electrical performance of the formed semiconductor structure may be undesired.

Figure 17:
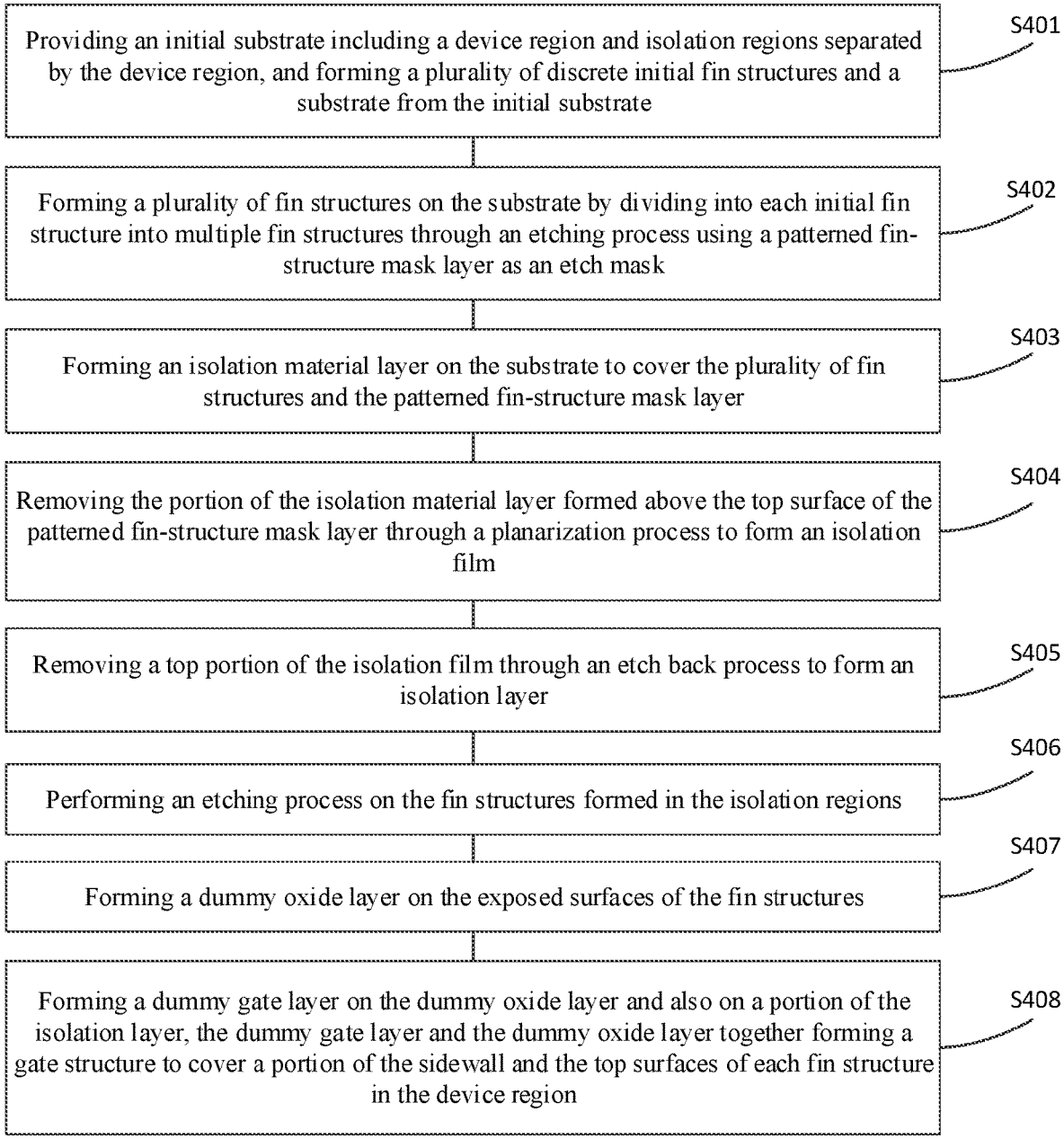
FIG. 17 illustrates a flowchart of an exemplary method for fabricating a semiconductor structure consistent with various embodiments of the present disclosure.

In order to further improve the electrical performance of semiconductor structures, the present disclosure provides a method for fabricating a semiconductor structure. FIG. 17 illustrates a flowchart of an exemplary method for fabricating a semiconductor structure consistent with various embodiments of the present disclosure. FIGS. 6-15 illustrate schematic views of semiconductor structures at certain stages of the exemplary fabrication method.

Figure 6:
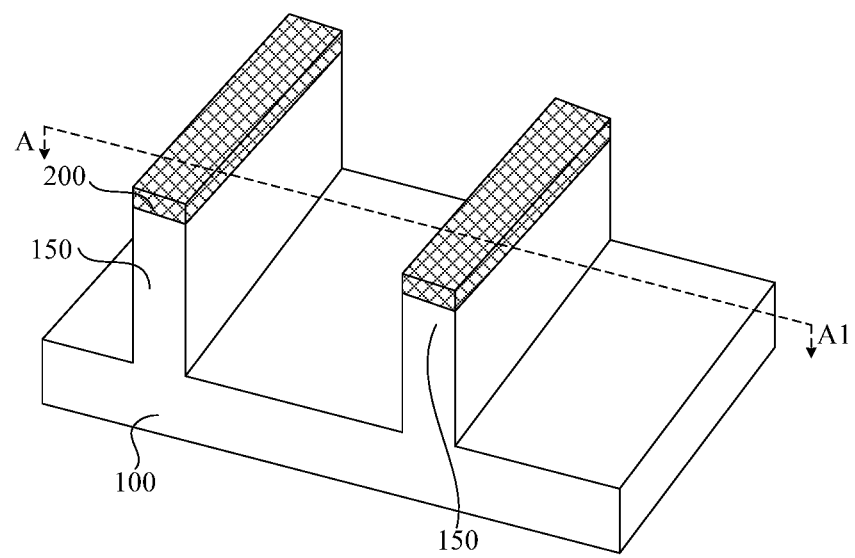
FIGS. 6-15 illustrate schematic views of semiconductor structures at certain stages of an exemplary method for fabricating a semiconductor structure consistent with various embodiments of the present disclosure.
Figure 7:
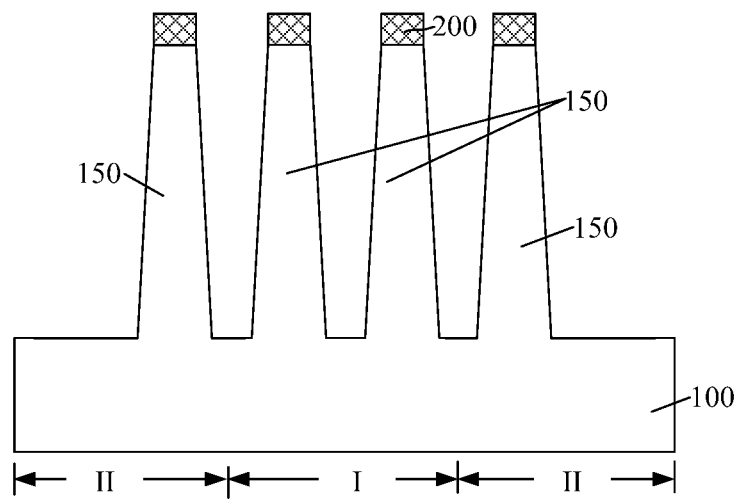

Referring to FIG. 17, at the beginning of the fabrication process, an initial substrate including a device region and isolation regions may be provided, and a plurality of discrete initial fin structures and a substrate may be formed from the initial substrate (S401). FIGS. 6-7 show schematic views of a semiconductor structure consistent with some embodiments of the present disclosure. Specifically, FIG. 6 shows a 3D schematic view of the semiconductor structure, and FIG. 7 shows a schematic cross-sectional view of the semiconductor structure shown in FIG. 6 along line "A-A1". For illustrative purposes, two initial fin structures are shown in FIG. 6, and four initial fin structures are shown in FIG. 7. However, both structural views shown in FIG. 6 and FIG. 7 may represent a same semiconductor structure and any number of the fin structures may be included in the disclosed semiconductor structure.

Referring to FIGS. 6-7, an initial substrate (not shown) may be provided. As shown in FIG. 7, the initial substrate may include a device region I and isolation regions II separated by the device region I. The device region I may be used to form semiconductor devices, and the isolation regions II may be used to form an isolation layer.

The initial substrate may be etched to form a substrate 100 and a plurality of discrete initial fin structures 150. The plurality of discrete initial fin structures 150 may be formed on both the device region I and the isolation regions II.

In one embodiment, the substrate 100 may be formed of silicon. In other embodiments, the substrate may be made of germanium, SiGe, SiC, GaAs, InAs, or any other appropriate semiconductor material. Alternatively, the substrate may be made of silicon on insulator (SOI), germanium on insulator (GOI), or any other composite semiconductor structure.

In one embodiment, referring to FIGS. 6-7, after providing the initial substrate and prior to etching the initial substrate, the fabrication method may also include forming a patterned fin-structure mask layer 200 on the initial substrate.

For example, the fin-structure mask layer 200 may be formed by a process including the following steps. A mask material layer (not shown) may be formed on the initial substrate. A patterned core layer (not shown) may be formed on the mask material layer. The patterned core layer may expose a portion of the mask material layer. A spacer film may be formed to cover the top and the sidewall surfaces of the core layer as well as the top surface of the mask material layer. Further, the portion of the spacer film formed on the top surfaces of the core layer and the mask material layer may be removed. As such, the portion of the spacer film formed on the sidewall surfaces of the core layer may be retained to form the fin-structure mask layer 200.

In one embodiment, the fin-structure mask layer 200 may be made of $SiO_x$. During the process to etch the initial substrate, the fin-structure mask layer 200 may be used as an etch mask.

In one embodiment, after forming a plurality of fin structures in a subsequent process, the fin-structure mask layer 200 formed on the top surfaces of the fin structures may be retained. In a subsequent planarization process, the top surface of the fin-structure mask layer 200 may be used to define the stop position for the planarization process. In addition, the fin-structure mask layer 200 may also provide protection for the plurality of fin structures.

Moreover, prior to forming the mask material layer on the initial substrate, the fabrication method may include forming a buffer material layer (not shown) on the initial substrate. In addition, during the process to etch the initial substrate using the fin-structure mask layer 200 as the etch mask, the buffer material layer may also be etched to form a buffer layer (not shown).

The buffer material layer may be used to provide buffering for the formation of the mask material layer such that dislocation occurred when the mask material layer is directly formed on the initial substrate may be avoided. In one embodiment, the buffer material layer may be made of $SiO_x$, and accordingly, the buffer layer may be made of $SiO_x$.

Figure 8:
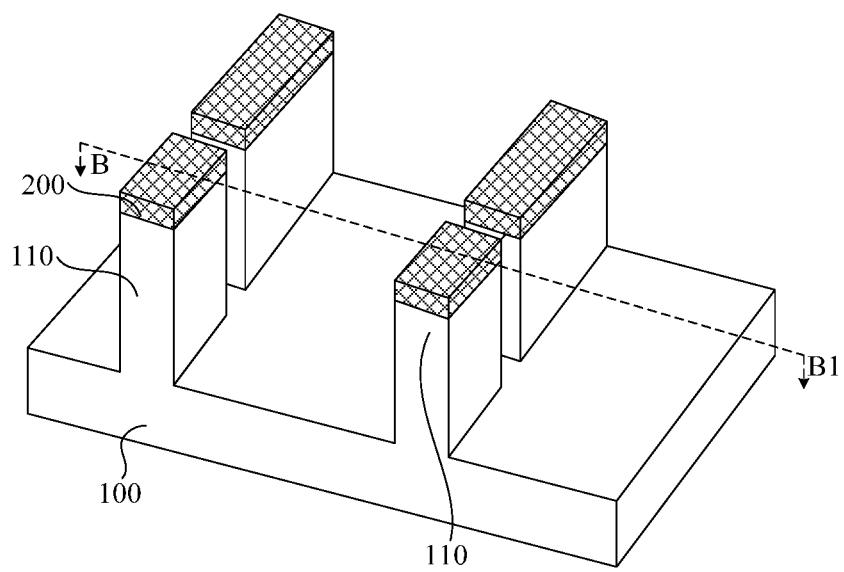
Figure 9:
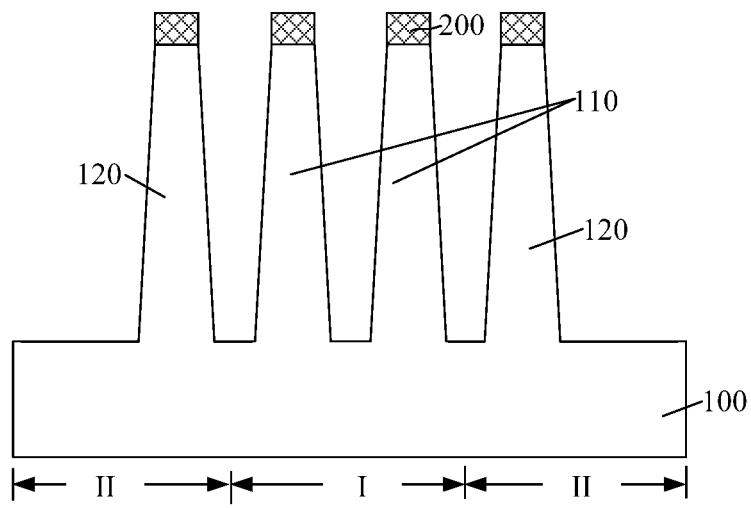

Further, returning to FIG. 17, a plurality of fin structures may be formed on the substrate by dividing each initial fin structure into multiple fin structures through an etching process using a patterned fin-structure mask layer as an etch mask, the fin structures formed in the device region may be first fin structures, and the fin structures formed in the isolation regions may be second fin structures (S402). FIGS. 8-9 show schematic views of a semiconductor structure consistent with some embodiments of the present disclosure. Specifically, FIG. 8 shows a 3D schematic view of the semiconductor structure, and FIG. 9 shows a schematic cross-sectional view of the semiconductor structure shown in FIG. 8 along line "B-B1".

Referring to FIGS. 8-9, a plurality of fin structures (not labeled) may be formed on the substrate 100 through a fin cut last process. Specifically, the fin structures formed in the device region I may be first fin structures 110, and the fin structures formed in the isolation regions II may be second fin structures 120.

In one embodiment, the substrate 100 may provide a process platform for the formation of Fin-FETs, and the first fin structures 110 may be used to provide the channels for the Fin-FETs.

The plurality of fin structures may be made of a same material as the substrate 100. In one embodiment, the substrate 100 is made of silicon, and accordingly, the plurality of fin structures may be made of silicon. That is, the first fin structures 110 and the second fin structures 120 are all made of silicon. In other embodiments, the plurality of fin structures may be made of germanium, SiGe, SiC, GaAs, InAs, or any other appropriate semiconductor material.

In one embodiment, a fin cut last process may be adopted to form the plurality of fin structures. The second fin structures 120 are the fin structures to be etched. The second fin structures 120 may be used to reduce the etch loading effect during the etching process to form the first fin structures 110, and thus improve the quality of the morphology of the first fin structures 110.

For example, after forming the plurality of discrete initial fin structures 150 (referring to FIGS. 6-7) on the substrate 100, the fabrication process may further include the following steps. Multiple patterned layers (not shown) may be formed across the plurality of initial fin structures 150. The patterned layers may cover a portion of the sidewall and the top surfaces of each initial fin structure 150. In addition, the patterned layers may also cover the surface of the substrate 100. Moreover, using the patterned layers as an etch mask, the initial fin structures 150 may be etched such that each initial fin structure 150 may be divided into multiple fin structures along the extending direction of the initial fin structure 150. Further, the patterned layers may be removed. In a subsequent process, each fin structure formed by etching the initial fin structure 150 may be used to form a Fin-FET.

In one embodiment, the fin-structure mask layer 200 covers the top surface of each initial fin structure 150. Accordingly, the multiple patterned layers may expose a portion of the fin-structure mask layer 200, and during the process to etch the initial fin structures 150 to form the plurality of fin structures, the exposed portion of the fin-structure mask layer 200 may also be removed.

In other embodiment, according to the requirements of actual process, the initial fin structures may not be etched. That is, the process to form the substrate and the plurality of fin structures may include providing an initial substrate, and then etching the initial substrate to form the substrate and the plurality of discrete fin structures on the substrate.

Referring to FIG. 9, for illustrative purpose, in one embodiment, the semiconductor structure is described to include two first fin structures 110 formed in the device region I, one second fin structure 120 formed in the isolation region II on one side of the device region I, and another second fin structure 120 formed in the isolation region II on the other side of the device region I. In other embodiments, the number of the first fin structures 110 may not be limited to two, the number of the second fin structures 120 formed on one side of the device region I may not be limited to one, and the number of the second fin structures 120 formed on the other side of the device region I may not be limited to one either.

Figure 10:
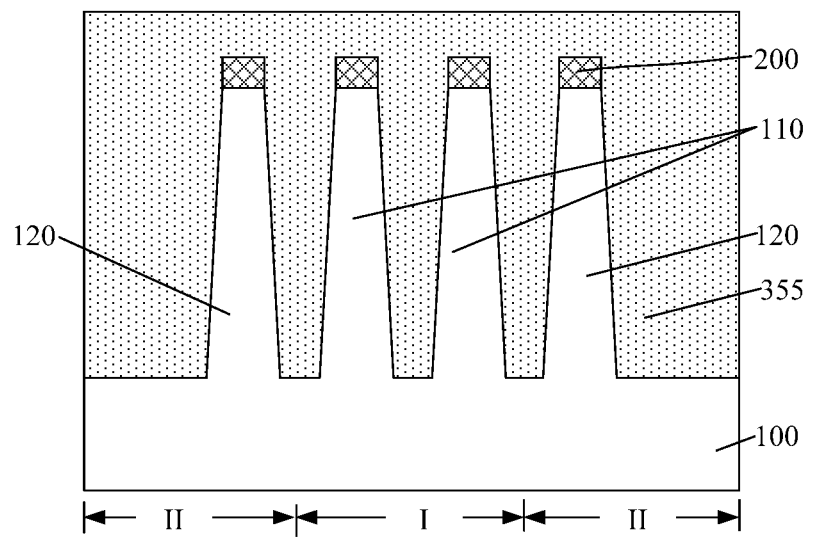

Further, returning to FIG. 17, an isolation material layer may be formed on the substrate to cover the plurality of fin structures and the fin-structure mask layer (S403). FIG. 10 illustrates a schematic cross-sectional view of a semiconductor structure consistent with some embodiments of the present disclosure.

Referring to FIG. 10, an isolation material layer 355 may be formed on the substrate to cover the plurality of fin structures and the fin-structure mask layer 200.

In one embodiment, in order to improve the gap-filling ability of the process for forming the isolation material layer 355, and thus ensure a desired density for the formed isolation material layer 355. In one embodiment, the isolation material layer 355 may be formed by a flowable chemical vapor deposition (FCVD) process. In other embodiments, the isolation material layer may be formed by a high respect ratio chemical vapor deposition process (HARP CVD) or any other appropriate deposition process.

In one embodiment, a fin-structure mask layer 200 is formed on the top surfaces of the plurality of fin structures. Accordingly, during the process to form the isolation material layer 355 on the substrate 100, the isolation material layer 355 may also cover the top surface of the fin-structure mask layer 200.

Figure 11:
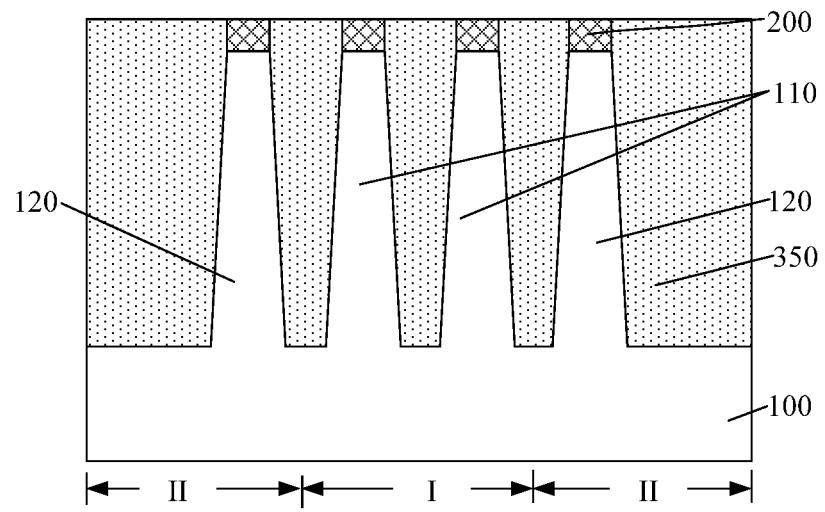

Further, returning to FIG. 17, the portion of the isolation material layer formed above the top surface of the fin-structure mask layer may be removed through a planarization process to form an isolation film (S404). FIG. 11 illustrates a schematic cross-sectional view of a semiconductor structure consistent with some embodiments of the present disclosure.

Referring to FIG. 11, after forming the isolation material layer 355 (referring to FIG. 10), the isolation material layer 355 may cover the top surface of the fin-structure mask layer 200, and accordingly, the portion of the isolation material layer 355 formed above the top surface of the fin-structure mask layer 200 may be removed through a planarization process to form an isolation film 350.

In one embodiment, the planarization process performed on the isolation material layer 355 may be a chemical mechanical polishing (CMP) process.

Figure 12:
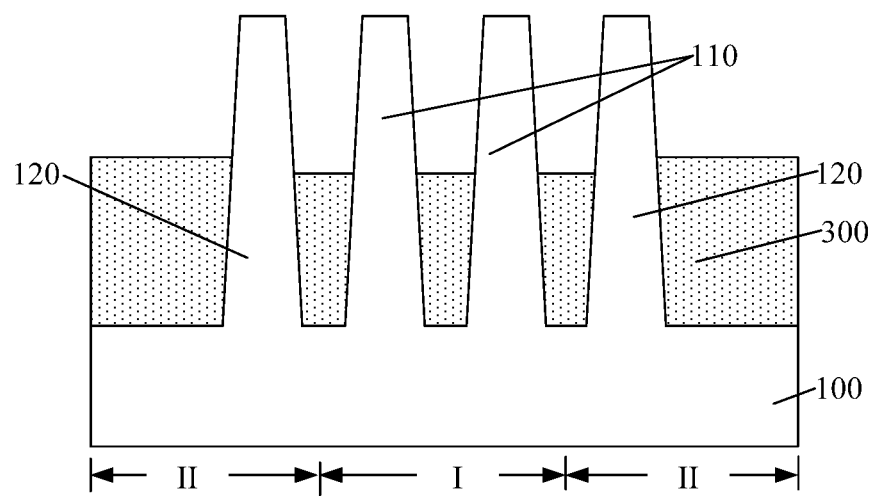

Returning to FIG. 17, further, a top portion of the isolation film may be removed through an etch-back process to form an isolation layer (S405). FIG. 12 illustrates a schematic cross-sectional view of a semiconductor structure consistent with some embodiments of the present disclosure.

Referring to FIG. 12, the isolation film 350 (referring to FIG. 11) may be etched back to form an isolation layer 300. In one embodiment, during the etch-back process, a top portion of the isolation film 350 may be etched using a gaseous hydrofluoric acid.

In one embodiment, after etching back the top portion of the isolation film 350 to form the isolation layer 300, the fin-structure mask layer 200 and the buffer layer (not shown) may be removed to expose the top surfaces of the plurality of fin structures.

The isolation layer 300 may cover a portion of the sidewall surfaces of the first fin structures 110 and the second fin structures 120.

The isolation layer 300 may serve as an isolation layer of semiconductor devices. The isolation layer may be used to isolate neighboring devices and may also be used to isolate neighboring fin structures. In one embodiment, the isolation layer 300 is made of $SiO_x$. In other embodiment, the isolation layer may be made of $SiN_x$, SiON, or any other appropriate material.

Moreover, after forming the isolation layer 300, the isolation layer 300 may have a same height on both sides of each first fin structure 110. In addition, because of the loading effect, the portion of the isolation layer 300 on the side of each second fin structure 120 that is away from the adjacent first fin structure 110 may be higher than the portion of the isolation layer 300 on the other side of the second fin structure 120 that is between the second fin structure 120 and the adjacent first fin structure 110. However, because that the second fin structures 120 are the fin structures to be etched in a subsequent process, the second fin structures 120 may not be used to form Fin-FETs. Therefore, the height difference between the two portions of the isolation layer 300 on the two sides of each second fin structure 120, respectively may have negligible effect on the electrical performance of the semiconductor structure.

In addition, when the semiconductor structure includes multiple second fin structures 120 along the direction perpendicular to the extending direction of the fin structure, only the two portions of the isolation layer 300 on the two sides of the second fin structure 120 farthest away from the device region I may have the height difference.

In one embodiment, prior to forming the isolation layer 300, each initial fin structure 150 (referring to FIG. 6) may be divided into multiple fin structures through etching. Accordingly, during the process to form the isolation layer 300, the isolation layer 300 may fill into the gaps between neighboring fin structures formed from a same initial fin structure 150. Therefore, by etching the initial fin structures 150 first and then forming the isolation layer 300, undesired effect on the isolation performance of the isolation layer 300 may be avoided.

Figure 13:
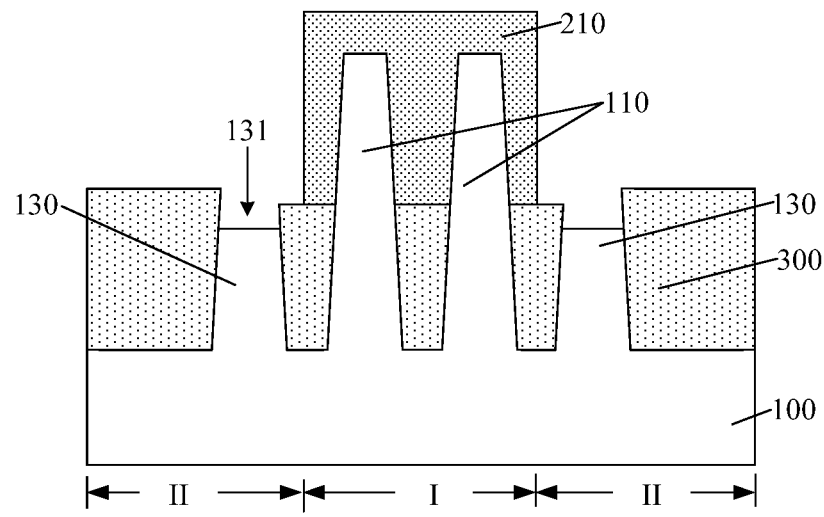

Further, returning to FIG. 17, after forming the isolation layer, an etching process may be performed on the fin structures formed in the isolation regions (S406). FIG. 13 illustrates a schematic cross-sectional view of a semiconductor structure consistent with some embodiments of the present disclosure.

Referring to FIG. 13, after forming the isolation layer 300, the fin structures (not labeled) formed in the isolation regions II may be etched. Therefore, the top portion of each fin structure formed in the isolation regions II may be removed through an etching process.

Specifically, the plurality of second fin structures 120 may be etched. In one embodiment, because a fin cut last process may be adopted, the plurality of second fin structures 120 may need to be further etched after forming the isolation layer 300.

In one embodiment, etching the plurality of second fin structures 120 may include the following exemplary steps. After forming the isolation layer 300, a photoresist layer 210 may be formed to cover the device region. Moreover, the plurality of second fin structures 120 may be etched using the photoresist layer 210 as an etch mask. Further, the photoresist layer 210 may be removed.

In order to avoid the photoresist layer 210 directly in contact with the first fin structures 110, and thus avoid undesired effect on the quality of the first fin structures 110, prior to forming the photoresist layer 210, a sacrificial oxide layer (not shown) may be formed to cover the surface of the plurality of first fin structures 110. Accordingly, after removing the photoresist layer 210, the sacrificial oxide layer may also be removed. In one embodiment, the sacrificial oxide layer may be made of $SiO_x$.

In one embodiment, the process to etch the plurality of second fin structures 120 may be a wet etching process. Because the second fin structures 120 may be made of silicon, the wet etching process may thus use an ammonia hydroxide ($NH_4OH$) or tetramethyl ammonium hydroxide (TMAH) solution as the etch solution. By using the wet etching process to etch the second fin structures 120, the consumption of the photoresist layer 210 may be reduced, and thus may be conducive to improving the etching result.

In other embodiments, the plurality of second fin structures may be etched through a dry etching process.

The plurality of second fin structures 120 may be non-effective fin structures. That is, the second fin structures 120 may not be used to form Fin-FETs. By etching the second fin structures 120, the isolation effect of the isolation layer 300 may be achieved, and forming Fin-FETs in the isolation regions II may also be prevented.

In one embodiment, in order to prevent causing undesired effect on the isolation layer 300 and also prevent forming Fin-FETs in the isolation regions, the etched amount of the second fin structures may not be too small. Therefore, in one embodiment, during the process to etch the plurality of second fin structures 120, the height of the etched amount may have a ratio with respect to the height of the second fin structure 120 greater than or equal to ⅓.

In one embodiment, in order to reduce the process difficulty in etching the second fin structures 120, a top portion of the second fin structures 120 may be partially removed through etching. In other embodiments, during the process to etch the second fin structures, the second fin structures may be entirely removed.

In one embodiment, in order to reduce the difficulty of the etching process, the height of the etched amount may be approximately ⅓ to ⅔ of the height of the second fin structure 120. After the etching process, the remaining portion of the second fin structures 120 may become a plurality of dummy fin structures 130.

Therefore, in one embodiment, after etching the plurality of second fin structures 120, a plurality of trenches 131 may be formed in the portion of the isolation layer 300 in the isolation regions II.

Figure 14:
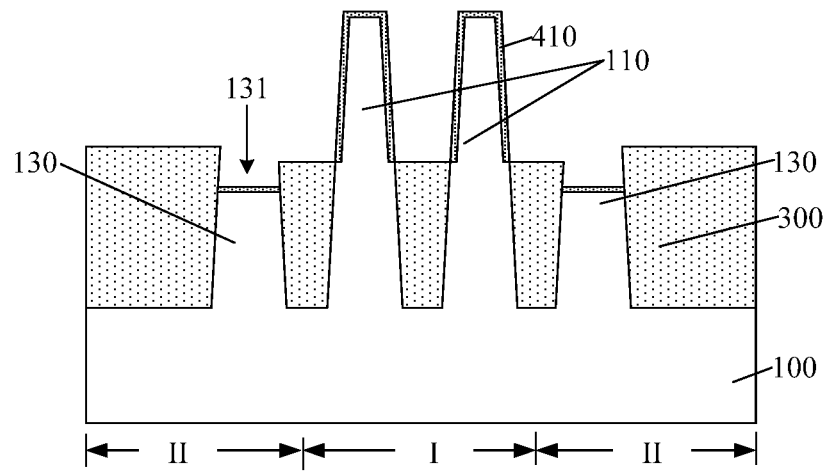

Further, returning to FIG. 17, a dummy oxide layer may be formed on the exposed surfaces of the fin structures (S407). FIG. 14 illustrates a schematic cross-sectional view of a semiconductor structure consistent with some embodiments of the present disclosure.

Referring to FIG. 14, after forming a plurality of dummy fin structures 130 by etching the second fin structures 120 (referring to FIG. 12) and removing the photoresist layer 210 (referring to FIG. 13), a dummy oxide layer 410 may be formed on the exposed surfaces of the fin structures. For example, the dummy oxide layer 410 may be formed on the top surface of each dummy fin structure 130, the top surface of each first fin structure 110, and the portion of the sidewall surfaces of each first fin structure 110 above the top surface of the isolation layer 300.

In one embodiment, the dummy oxide layer 410 may be formed by a thermal oxidation process. For example, the thermal oxidation process may be an in-situ stream generation (ISSG) process.

Moreover, during the ISSG process, the reaction gas may only react with silicon material. Therefore, the dummy oxide layer 410 may be formed by consuming the plurality of first fin structures 110 and the plurality of dummy fin structures 130. As such, the dummy oxide layer 410 may be formed on the exposed surfaces of the first fin structures 110 and the top surface of the dummy fin structures 130.

Figure 15:
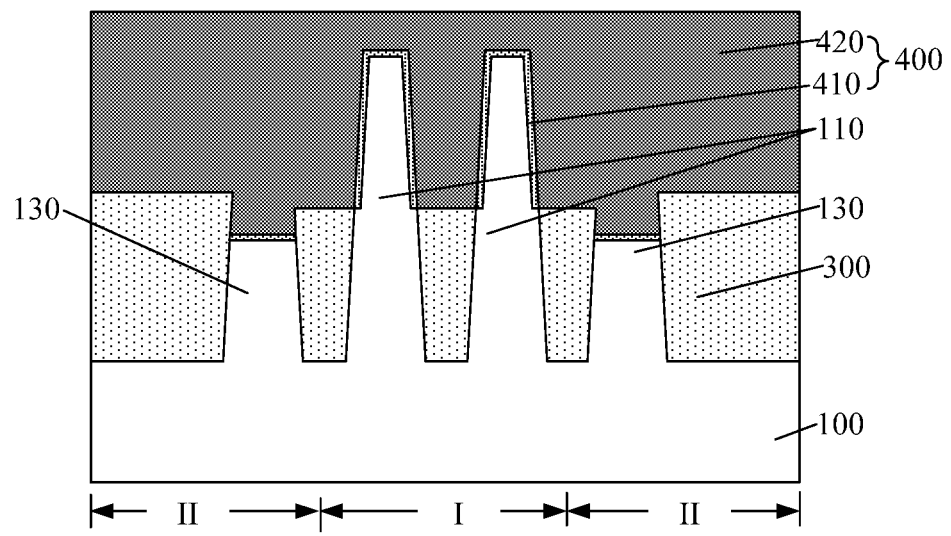

Further, returning to FIG. 17, a dummy gate layer may be formed on the dummy oxide layer and also on a portion of the isolation layer, and the dummy gate layer together with the dummy oxide layer form a gate structure covering a portion of the sidewall and the top surfaces of each fin structure in the device region (S408). FIG. 15 illustrates a schematic cross-sectional view of a semiconductor structure consistent with some embodiments of the present disclosure.

Referring to FIG. 15, a dummy gate layer 420 may be formed on the dummy oxide layer 410. The dummy gate layer 420 may also cover a portion of the isolation layer 300. The dummy gate layer 420 and the dummy oxide layer 410 may together form a gate structure 400. Therefore, the gate structure 400 may be formed across the fin structures in the device region I and may cover a portion of the sidewall and the top surfaces of each fin structure formed in the device region I.

In one embodiment, after removing a portion of each second fin structure 120 (referring to FIG. 12), a plurality of trenches 131 (referring to FIG. 13) may be formed in the portion of the isolation layer 300 in the isolation regions II. Accordingly, when forming the gate structure 400 across the first fin structures 110, the gate structure 400 may also be formed in the plurality of trenches 131.

The gate structure 400 may be used to control the channel of the formed Fin-FETs switching between the turn-on status and the turn-off status. Therefore, the gate structure 400 may be formed across the plurality of first fin structures 110 and may cover a portion of the sidewall and the top surfaces of the plurality of first fin structures 110.

In one embodiment, the gate structure 400 may be a dummy gate structure. The gate structure 400 may thus be used to occupy a space position for a metal gate structure in the subsequently formed Fin-FET device. In other embodiments, the gate structure may be a metal gate structure.

In one embodiment, the gate structure 400 may have a multiple-layer structure. As shown in FIG. 15, the gate structure 400 may include the dummy oxide layer 410 and the dummy gate layer 420 formed on the dummy oxide layer 410. The dummy gate layer 420 may be made of polycrystalline silicon, $SiO_x$, $SiN_x$, SiON, SiC, SiCN, SiCON, or amorphous silicon. The dummy oxide layer 410 may be made of $SiO_x$ or SiON. In one embodiment, the dummy gate layer 420 may be made of polycrystalline silicon and the dummy oxide layer 410 may be made of $SiO_x$.

In other embodiments, the gate structure may have a single layer structure. For example, the gate structure may only include a dummy gate layer.

In one embodiment, the process to form the gate structure 400 may include the following exemplary steps. A dummy oxide layer 410 may be formed on the surfaces of the first fin structures 110 and also on the top surfaces of the dummy fin structures 130. A dummy gate material layer may then be formed to cover the dummy oxide layer 410. The dummy gate material layer may also cover the top surface of the isolation layer 300. A planarization process may be performed on the dummy gate material layer. After the planarization process, the remaining dummy gate material layer may become a dummy gate film. Further, the dummy gate film may be patterned to form the dummy gate layer 420.

Therefore, in one embodiment, in addition to covering a portion of the sidewall and the top surfaces of each first fin structure 110, the dummy gate layer 420 may also cover a portion of the top surface of each dummy fin structure 130. Moreover, the dummy gate layer 420 may also be formed on a portion of the top surface of the isolation layer 300.

According to the present disclosure, the plurality of second fin structures 120 are etched after the isolation layer 300 is formed. As compared to a method in which the second fin structures are etched prior to forming the isolation layer, the disclosed method may ensure an identical environment for the two sides of each first fin structure 110 during the process to form the isolation layer 300. Therefore, the disclosed method may be able to avoid the loading effect, and thus the problem of having an inconsistent height for the isolation layer 300 on the two sides of the first fin structure 110 may be avoided. That is, using the disclosed method of the present disclosure, the height of each first fin structure 110 exposed by the isolation layer 300 may be the same, which may further improve the electrical performance of the formed semiconductor structure.

Figure 16:
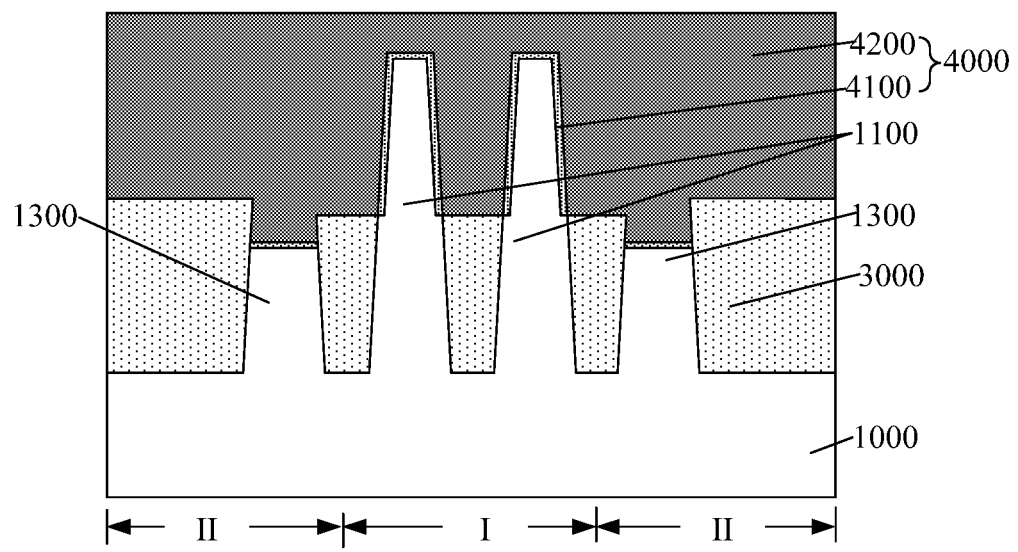
FIG. 16 illustrates a schematic view of an exemplary semiconductor structure consistent with various embodiments of the present disclosure.

Further, the present disclosure also provides a semiconductor structure. FIG. 16 illustrates a schematic cross-sectional view of an exemplary semiconductor structure consistent with various embodiments of the present disclosure.

Referring to FIG. 16, the semiconductor structure may include a substrate 1000. The substrate 100 may include a device region I and isolation regions II separated by the device region I. The semiconductor structure may also include a plurality of fin structures 1100 formed on the substrate 1000 of the device region I, and an isolation layer 3000 formed on the substrate 1000. The top surface of the isolation layer 3000 may be lower than the top surfaces of the fin structures 1100. The height of each fin structure 1100 exposed by the isolation layer 3000 may be the same.

The substrate 1000 may provide a process platform for the formation of Fin-FETs. For example, the device region I may be used to form a plurality of semiconductor devices, and the plurality of fin structures 1100 may be used to provide the channels for the Fin-FETs.

In one embodiment, a fin cut last process may be adopted. Therefore, the etch loading effect may be reduced during the etching process to form the first fin structures 1100, and thus improve the quality of the morphology of the first fin structures 1100.

Therefore, in one embodiment, the semiconductor structure may also include a plurality of dummy fin structures 1300 formed on the substrate 1000 of the isolation regions II. The top surfaces of the dummy fin structures 1300 may be lower than the top surface of the isolation layer 3000.

The plurality of dummy fin structures 1300 may be formed by etching the fin structures 1100 in the isolation regions II after the isolation layer 3000 is formed.

Accordingly, during the process to form the isolation layer 3000, the environments on both sides of each fin structure 1100 in the device region I may be the same such that the loading effect may be avoided. Therefore, according to the disclosed semiconductor structure, the portion of each first fin structure 1100 exposed by the isolation layer 3000 may have an identical height. That is, the isolation layer 3000 may have a same height on both sides of the first fin structure 1100 in the device region I. Compared to semiconductor structures in which the heights of the isolation layer are different on the two sides of a fin structure, the disclosed semiconductor structure may demonstrate more desirable electrical performance.

Moreover, for illustrative purpose, in one embodiment, the semiconductor structure is described to include two first fin structures 1100 formed in the device region I, one dummy fin structure 1300 formed in the isolation regions II on one side of the device region I, and another dummy fin structure 1300 formed in the isolation regions II on the other side of the device region I. In other embodiments, the number of the first fin structures 1100 may not be limited to two, the number of the dummy fin structures 1300 formed on one side of the device region I may not be limited to one, and the number of the dummy fin structures 1300 formed on the other side of the device region I may not be limited to one either.

Further, the semiconductor structure may also include a gate structure 4000 formed across the plurality of fin structures 1100 in the device region I. The gate structure 4000 may cover a portion of the sidewall and the top surfaces of each fin structure 1100 in the device region I.

In one embodiment, the gate structure 4000 may be a dummy gate structure. The gate structure 4000 may thus be used to occupy a space position for a metal gate structure in the subsequently formed Fin-FET device. In other embodiments, the gate structure may be a metal gate structure.

In one embodiment, the gate structure 4000 may have a multiple-layer structure. For example, the gate structure 4000 may include a dummy oxide layer 4100 and a dummy gate layer 4200 formed on the dummy oxide layer 4100. The dummy gate layer 4200 may be made of polycrystalline silicon, $SiO_x$, $SiN_x$, SiON, SiC, SiCN, SiCON, or amorphous silicon. The dummy oxide layer 4100 may be made of $SiO_x$ or SiON. In one embodiment, the dummy gate layer 4200 may be made of polycrystalline silicon and the dummy oxide layer 4100 may be made of $SiO_x$.

In other embodiments, the gate structure may have a single layer structure. For example, the gate structure may only include a dummy gate layer.

In one embodiment, the dummy oxide layer 4100 may be formed on the surfaces of the fin structures 1100 and the top surfaces of the dummy fin structures 1300. In addition to covering a portion of the sidewall and the top surfaces of each first fin structure 1100, the dummy gate layer 4200 may also cover a portion of the top surface of each dummy fin structure 1300. Moreover, the dummy gate layer 4200 may also be formed on a portion of the top surface of the isolation layer 3000.

The disclosed semiconductor may be formed according to the method described above. The detailed description of the disclosed semiconductor structure may be referred to the corresponding illustration provided above.

Compared to conventional semiconductor structures and fabrication methods, the disclosed semiconductor structures and fabrication methods may demonstrate advantages.

According to the disclosed semiconductor structures and fabrication methods, the fin structures formed in the isolation regions are etched after the isolation layer is formed. As compared to a method in which the fin structures in the device region are etched prior to forming the isolation layer, the disclosed method may ensure an identical environment for both sides of each fin structure in the device region during the process to form the isolation layer. Therefore, the disclosed method may be able to avoid the loading effect, and thus the problem of having an inconsistent height for the isolation layer on the two sides of the first fin structure may be avoided. That is, using the disclosed method of the present disclosure, the height of each fin structure in the device region exposed by the isolation layer may be the same, which may further improve the electrical performance of the formed semiconductor structure.

Moreover, prior to forming the isolation layer, each initial fin structure may be divided into multiple fin structures through etching. Accordingly, during the process to form the isolation layer, the isolation layer may fill into the gaps between neighboring fin structures formed from a same initial fin structure. Therefore, by etching the initial fin structures first and then forming the isolation layer, undesired effect on the isolation performance of the isolation layer may be avoided.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a substrate including: isolation regions and a device region between adjacent isolation regions;
   forming a plurality of fin structures, including a first plurality of fin structures on the isolation regions and a second plurality of fin structures on the device region of the substrate;
   forming an isolation layer on the substrate between adjacent fin structures, the isolation layer having a top surface lower than top surfaces of the fin structures;
   etching the first plurality of fin structures on the isolation regions after forming the isolation layer, wherein after etching the first plurality of fin structures, a remaining portion of the first plurality of fin structures are lower than the second plurality of fin structures; and
   forming a gate structure across the second plurality of fin structures on the device region after etching the first plurality of fin structures formed on the isolation regions, the gate structure covering a portion of sidewall and top surfaces of each fin structure of the second plurality of fin structures on the device region.

2. The method for fabricating the semiconductor structure according to claim 1,
   wherein forming the isolation layer on the substrate includes:
   forming an isolation material layer on the substrate to cover the top surfaces of the fin structures;
   performing a planarization process on the isolation material layer to form an isolation film by removing a portion of the isolation material layer formed above the top surfaces of the fin structures; and
   performing an etch-back process to remove a portion of the isolation film, wherein a remaining portion of the isolation film serves as the isolation layer.

3. The method for fabricating the semiconductor structure according to claim 2,
   wherein:
   during the etch-back process to remove the portion of the isolation film, a gaseous hydrofluoric acid is used to etch the portion of the isolation film.

4. The method for fabricating the semiconductor structure according to claim 1,
   wherein providing the substrate and the plurality of fin structures includes:
   providing an initial substrate;
   etching the initial substrate to form the substrate and a plurality of discrete initial fin structures on the substrate;
   forming multiple patterned layers across the initial fin structure, wherein the patterned layers cover a portion of sidewall and top surfaces of each initial fin structure and also cover a surface of the substrate;
   etching the initial fin structures using the patterned layers as an etch mask to divide each initial fin structure into a plurality of fin structures; and
   removing the patterned layers.

5. The method for fabricating the semiconductor structure according to claim 1,
   wherein:
   when etching the first plurality of fin structures on the isolation regions, a height of an etched amount has a ratio with respect to a height of the fin structure greater than or equal to ⅓.

6. The method for fabricating the semiconductor structure according to claim 5,
wherein:
when etching the first plurality of fin structures on the isolation regions, the height of the etched amount is approximately 1/3 to 2/3 of the height of the fin structure in the isolation regions.

7. The method for fabricating the semiconductor structure according to claim 1,
wherein:
when etching the first plurality of fin structures on the isolation regions, each fin structure in the isolation regions is fully removed.

8. The method for fabricating the semiconductor structure according to claim 1,
wherein:
after etching the first plurality of fin structures on the isolation regions, a plurality of trenches are formed in the isolation layer of the isolation regions.

9. The method for fabricating the semiconductor structure according to claim 8,
wherein:
when forming the gate structure across the second plurality of fin structures on the device region, the gate structure is also formed in the trenches.

10. A method for fabricating a semiconductor structure, comprising:
providing a substrate including: isolation regions and a device region between adjacent isolation regions;
forming a plurality of fin structures, including a first plurality of fin structures on the isolation regions and a second plurality of fin structures on the device region of the substrate;
forming an isolation layer on the substrate between adjacent fin structures, the isolation layer having a top surface lower than top surfaces of the fin structures;
etching the first plurality of fin structures on the isolation regions after forming the isolation layer, wherein:
when etching the first plurality of fin structures on the isolation regions, a top portion of each fin structure in the isolation regions is removed to form a dummy fin structure; and
forming a gate structure across the second plurality of fin structures on the device region after etching the first plurality of fin structures formed on the isolation regions, the gate structure covering a portion of sidewall and top surfaces of each fin structure of the second plurality of fin structures on the device region.

11. The method for fabricating the semiconductor structure according to claim 10, wherein forming the isolation layer on the substrate includes:
forming an isolation material layer on the substrate to cover the top surfaces of the fin structures;
performing a planarization process on the isolation material layer to form an isolation film by removing a portion of the isolation material layer formed above the top surfaces of the fin structures; and
performing an etch-back process to remove a portion of the isolation film, wherein a remaining portion of the isolation film serves as the isolation layer.

12. The method for fabricating the semiconductor structure according to claim 11,
wherein:
during the etch-back process to remove the portion of the isolation film, a gaseous hydrofluoric acid is used to etch the portion of the isolation film.

13. The method for fabricating the semiconductor structure according to claim 10,
wherein providing the substrate and the plurality of fin structures includes:
providing an initial substrate;
etching the initial substrate to form the substrate and a plurality of discrete initial fin structures on the substrate;
forming multiple patterned layers across the initial fin structure, wherein the patterned layers cover a portion of sidewall and top surfaces of each initial fin structure and also cover a surface of the substrate;
etching the initial fin structures using the patterned layers as an etch mask to divide each initial fin structure into a plurality of fin structures; and
removing the patterned layers.

14. The method for fabricating the semiconductor structure according to claim 10,
wherein:
when etching the first plurality of fin structures on the isolation regions, a height of an etched amount has a ratio with respect to a height of the fin structure greater than or equal to 1/3.

15. The method for fabricating the semiconductor structure according to claim 14,
wherein:
when etching the first plurality of fin structures on the isolation regions, the height of the etched amount is approximately 1/3 to 2/3 of the height of the fin structure in the isolation regions.

16. The method for fabricating the semiconductor structure according to claim 10,
wherein:
when etching the first plurality of fin structures on the isolation regions, each fin structure in the isolation regions is fully removed.

17. The method for fabricating the semiconductor structure according to claim 10,
wherein:
after etching the first plurality of fin structures on the isolation regions, a plurality of trenches are formed in the isolation layer of the isolation regions.

18. The method for fabricating the semiconductor structure according to claim 17,
wherein:
when forming the gate structure across the second plurality of fin structures on the device region, the gate structure is also formed in the trenches.

* * * * *